United States Patent
Ono et al.

(10) Patent No.: US 7,897,993 B2
(45) Date of Patent: Mar. 1, 2011

(54) GAN BASED LUMINESCENT DEVICE ON A METAL SUBSTRATE

(75) Inventors: Yoshinobu Ono, Ibaraki (JP); Sadanori Yamanaka, Ibaraki (JP)

(73) Assignee: Sumitomo Chemical Company, Limited, Tokyo (JP)

(*) Notice: Subject to any disclaimer, the term of this patent is extended or adjusted under 35 U.S.C. 154(b) by 100 days.

(21) Appl. No.: 11/661,266

(22) PCT Filed: Aug. 30, 2005

(86) PCT No.: PCT/JP2005/016191
§ 371 (c)(1),
(2), (4) Date: Feb. 27, 2007

(87) PCT Pub. No.: WO2006/025571
PCT Pub. Date: Mar. 9, 2006

(65) Prior Publication Data
US 2007/0295984 A1    Dec. 27, 2007

(30) Foreign Application Priority Data
Aug. 31, 2004   (JP) .......................... 2004-251726

(51) Int. Cl.
H01L 33/00   (2010.01)
(52) U.S. Cl. .................. 257/103; 257/79; 257/94; 257/E33.026; 257/E33.027; 257/E33.028; 257/E33.029; 257/E33.041
(58) Field of Classification Search ............... 257/103, 257/79, 94, E33.026–E33.041
See application file for complete search history.

(56) References Cited

U.S. PATENT DOCUMENTS

| 6,060,730 | A | 5/2000 | Tsutsui |
| 6,559,075 | B1 | 5/2003 | Kelly et al. |
| 2004/0072383 | A1* | 4/2004 | Nagahama et al. ............ 438/47 |
| 2004/0240501 | A1* | 12/2004 | Katoda ........................ 372/43 |
| 2008/0164571 | A1 | 7/2008 | Kelly et al. |

FOREIGN PATENT DOCUMENTS

| EP | 1 137 077 A2 | 9/2001 |
| EP | 1 180 725 A2 | 2/2002 |
| EP | 1 385 215 A2 | 1/2004 |
| JP | 06-260682 A | 9/1994 |
| JP | 07-015041 A | 1/1995 |
| JP | 07-249792 A | 9/1995 |
| JP | 09-036430 A | 2/1997 |
| JP | 09-064419 A | 3/1997 |
| JP | 09-116130 A | 5/1997 |
| JP | 10321956 | * 12/1998 |
| JP | 11-238913 A | 8/1999 |
| JP | 2001-501778 B | 2/2001 |
| JP | 2004-047704 | 2/2004 |

* cited by examiner

*Primary Examiner*—Cuong Q Nguyen
*Assistant Examiner*—Trang Q Tran
(74) *Attorney, Agent, or Firm*—Fitch, Even, Tabin & Flannery

(57) ABSTRACT

A compound semiconductor luminescent device characterized by comprising an electroconductive substrate, a compound semiconductor function layer including a GaN layer, an electrode, an adhesiveness-enhancing layer, and a bonding layer, which are stacked in this order wherein the above-described electroconductive substrate includes a metal material that indicates a thermal expansion coefficient different by $1.5 \times 10^{-6}/°$ C. or less from GaN.

4 Claims, 1 Drawing Sheet

GAN BASED LUMINESCENT DEVICE ON A METAL SUBSTRATE

This Application is the National Phase of International Application No. PCT/JP2005/016191 filed Aug. 30, 2005, which designated the U.S. and was published under PCT Article 21(2) in English, and claims, via the aforesaid International Application, the foreign priority benefit of and claims the priority from Japanese Application No. 2004-251726, filed Aug. 31, 2004, the complete disclosures of each of the aforesaid applications are incorporated herein by reference.

TECHNICAL FIELD

The present invention relates to compound semiconductor luminescent devices.

BACKGROUND ART

As compound semiconductor luminescent devices including a GaN layer, such as blue LEDs have been widely utilized, compound semiconductor luminescent devices having a larger luminescence output have been required.

In a conventional compound semiconductor luminescent device, a compound semiconductor function layer including a GaN layer is provided on a growth substrate made of electricity-insulating sapphire, and two electrodes are provided on the compound semiconductor function layer. In the case of the conventional compound semiconductor luminescent device, two light-opaque electrodes provided on a luminescent surface obstructs luminescent light, thereby lowering the luminescence output, wherein the luminescent surface is the one of the two surfaces of the compound semiconductor function layer, that is opposite to the sapphire growth substrate.

Therefore, a compound semiconductor luminescent device has been proposed (for example, see Patent Reference 1) which has a structure consisting of an electroconductive substrate (thermal expansion coefficient of $16.2 \times 10^{-6}/°C.$) consisting of Cu, a compound semiconductor function layer including a GaN layer, and an electrode that are stacked in this order. With such a structure, another electrode can be provided on the opposite surface to the one of the electroconductive substrate on which the compound semiconductor function layer is provided, or the electroconductive substrate can play the role of the another electrode; therefore, only a single electrode can be provided on the luminescent surface.

EP-1385215 A2 (Patent Reference 2) describes a method of producing a nitride semiconductor device having at least one or more p-type nitride semiconductor layers, an active layer with a quantum well structure including at least a well layer made of $Al_aIn_bGa_{1-a-b}N$ ($0 \leq a \leq 1$, $0 \leq b \leq 1$, $a+b \leq 1$) and a barrier layer made of $Al_cIn_dGa_{1-c-d}N$ ($0 \leq c \leq 1$, $0 \leq d \leq 1$, $c+d \leq 1$), and one or more n-type nitride semiconductor layers on one principal surface of a substrate having two opposing principal surfaces, the method comprising growing at least an n-type nitride semiconductor layer, an active layer, and a p-type nitride semiconductor layer on one principal surface of a growth substrate having two opposing principal surfaces and having a thermal expansion coefficient larger than those of the above-described n-type and p-type nitride semiconductor layers to form a bonding laminate, and providing a first bonding layer made of one or more metal layers on the above-described p-type nitride semiconductor layer, while providing a second bonding layer made of one or more metal layers on one principal surface of a substrate having two opposing principal surfaces and having a thermal expansion coefficient that is larger than those of the above-described n-type and p-type nitride semiconductor layers and the same as or smaller than that of the above-described growth substrate; causing the first bonding layer and the second bonding layer to oppose each other to bond the bonding laminate with the above-described substrate by heat pressure welding; and removing the growth substrate of the above-described bonding laminate. However further higher luminescence output has been required, i.e., a compound semiconductor luminescent device has been required that employs an electroconductive substrate made of a metal, includes a GaN layer, and has a further higher luminescence output.

[Patent Reference 1] JP-A-2004-47704
[Patent Reference 2] EP 1385215 A2

DISCLOSURE OF THE INVENTION

It is an object of the present invention to provide a compound semiconductor luminescent device that employs an electroconductive substrate including metal, includes a GaN layer, and has a high luminescence output.

In order to solve the foregoing problems, the present inventors have earnestly studied compound semiconductor luminescent devices that each employ an electroconductive substrate including a metal, and include a GaN layer, and thus have accomplished the present invention.

That is, the present invention relates to:

[1] A compound semiconductor luminescent device characterized by comprising:
an electroconductive substrate;
a compound semiconductor function layer including a GaN layer;
an electrode;
an adhesiveness-enhancing layer; and
a bonding layer, which are stacked in this order,
wherein the above-described electroconductive substrate includes a metal material that indicates a thermal expansion coefficient different by $1.5 \times 10^{-6}/°C.$ or less from GaN, and

[2] A compound semiconductor luminescent device characterized by having:
an electroconductive substrate;
a compound semiconductor function layer including a GaN layer;
an electrode;
an adhesiveness-enhancing layer; and
a bonding layer in this order,
wherein the above-described electroconductive substrate includes a metal material that indicates a thermal expansion coefficient different by $1.5 \times 10^{-6}/°C.$ or less from GaN.

The present invention further relates to:
[3] The compound semiconductor luminescent device according to [1] or [2], wherein the above-described metal material is mainly composed of one or more selected from the group consisting of W, Mo, Hf, La, Ta, Ir, Ru, Os, and Nb,

[4] The compound semiconductor luminescent device according to [1] or [2], wherein the above-described metal material is one selected from the group consisting of W, Mo, Hf, La, Ta, Ir, Ru, Os, and Nb,

[5] A compound semiconductor luminescent device comprising:
an electroconductive substrate;
a compound semiconductor function layer including a GaN layer;
an electrode;
an adhesiveness-enhancing layer; and
a bonding layer, which are stacked in this order, wherein the above-described electroconductive substrate includes a metal material that has a thermal expansion coefficient smaller by $1.5 \times 10^{-6}/°$ C. or less than that of GaN,

[6] A compound semiconductor luminescent device having:

an electroconductive substrate;

a compound semiconductor function layer including a GaN layer;

an electrode;

an adhesiveness-enhancing layer; and a bonding layer in this order, wherein the above-described electroconductive substrate includes a metal material that has a thermal expansion coefficient smaller by $1.5 \times 10^{-6}/°$ C. or less than that of GaN,

[7] The compound semiconductor luminescent device according to [5] or [6], wherein the metal material is mainly composed of one or more selected from the group consisting of W and Mo,

[8] The compound semiconductor luminescent device according to [5] or [6], wherein the metal material is one selected from the group consisting of W and Mo,

[9] The compound semiconductor luminescent device according to any one of [1] to [8], wherein the compound semiconductor function layer including a GaN layer has at least an n-type electroconductive layer, a nitride compound semiconductor layer with a luminescence layer, and a p-type electroconductive layer in this order,

[10] The compound semiconductor luminescent device according to any one of [1] to [9], wherein the adhesiveness-enhancing layer is a metal material composed of TiPt, and the bonding layer is a metal material composed of AuSn,

[11] A method of producing the compound semiconductor luminescent device according to any one of [1] to [10], characterized by having:

(1) the step of stacking a compound semiconductor function layer including a GaN layer on a growth substrate to obtain a laminate 1;

(2) the step of stacking an electrode, an adhesiveness-enhancing layer and a bonding layer in this order on the compound semiconductor function layer including a GaN layer of the laminate 1 to obtain a laminate 2;

(3) the step of bonding the bonding layer of the laminate 2 with an adhesiveness-enhancing layer of a laminate 3 obtained by stacking the adhesiveness-enhancing layer on a separately prepared electroconductive substrate to obtain a laminate 5, or the step of bonding the bonding layer of the laminate 2 with a bonding layer of a laminate 4 obtained by stacking an adhesiveness-enhancing layer and the bonding layer on a separately prepared electroconductive substrate to obtain a laminate 5;

(4) the step of removing the growth substrate from the laminate 5 obtained in the above-described step (3) to obtain a laminate 6; and (5) the step of device-dividing the laminate 6 obtained in the above-described step (4);

in this order,

[12] A method of producing the compound semiconductor luminescent device according to any one of [1] to [10], characterized by having:

(1) the step of stacking a compound semiconductor function layer including a GaN layer on a growth substrate to obtain a laminate 1;

(2) the step of forming a device separation groove in the compound semiconductor function layer including a GaN layer of the laminate 1 and stacking an electrode, an adhesiveness-enhancing layer and a bonding layer in this order on the separated compound semiconductor function layer to obtain a laminate 7, or the step of stacking an electrode on the compound semiconductor function layer including a GaN layer of the laminate 1, forming a device separation groove in the above-described compound semiconductor function layer and electrode, and stacking an adhesiveness-enhancing layer and a bonding layer in this order on the separated electrode to obtain a laminate 8, or the step of stacking an electrode and an adhesiveness-enhancing layer in this order on the compound semiconductor function layer including a GaN layer of the laminate 1, forming a device separation groove in the above-described compound semiconductor function layer, electrode and adhesiveness-enhancing layer and stacking a bonding layer on the separated adhesiveness-enhancing layer to obtain a laminate 9, or the step of stacking an electrode, an adhesiveness-enhancing layer and a bonding layer in this order on the compound semiconductor function layer including a GaN layer of the laminate 1, and forming a device separation groove in the above-described compound semiconductor function layer, adhesiveness-enhancing layer and bonding layer to obtain a laminate 10;

(3) the step of bonding the bonding layer of any of the laminate 7, the laminate 8, the laminate 9 and the laminate 10 with an adhesiveness-enhancing layer of a laminate 3 obtained by stacking the adhesiveness-enhancing layer on a separately prepared electroconductive substrate to obtain a laminate 11, or the step of bonding the bonding layer of any of the laminate 7, the laminate 8, the laminate 9 and the laminate 10 with a bonding layer of a laminate 4 obtained by stacking an adhesiveness-enhancing layer and the bonding layer on a separately prepared electroconductive substrate to obtain a laminate 11;

(4) the step of removing the growth substrate from the laminate 11 obtained in the above-described step (3) to obtain a laminate 12; and (5) the step of cutting the laminate 12 along the device separation groove formed in the above-described step (2);

in this order,

[13] The method according to [11] or [12], wherein the above-described step (1) is the step of stacking at least an n-type electroconductive layer, a nitride compound semiconductor layer with a luminescence layer, and a p-type electroconductive layer in this order on a growth substrate, and

[14] The method according to any one of [11] to [13], wherein the metal material is mirror-surface polished.

Because the compound semiconductor luminescent device of the present invention exhibits a higher luminescence output than the conventional compound semiconductor luminescent devices do, it can be suitably applied not only to indoor display uses but also to uses that require a high luminescence output, such as illumination, outdoor display, display unit, and signal light, and thus is very industrially useful.

BEST MODE FOR CARRYING OUT THE INVENTION

Figure 1:
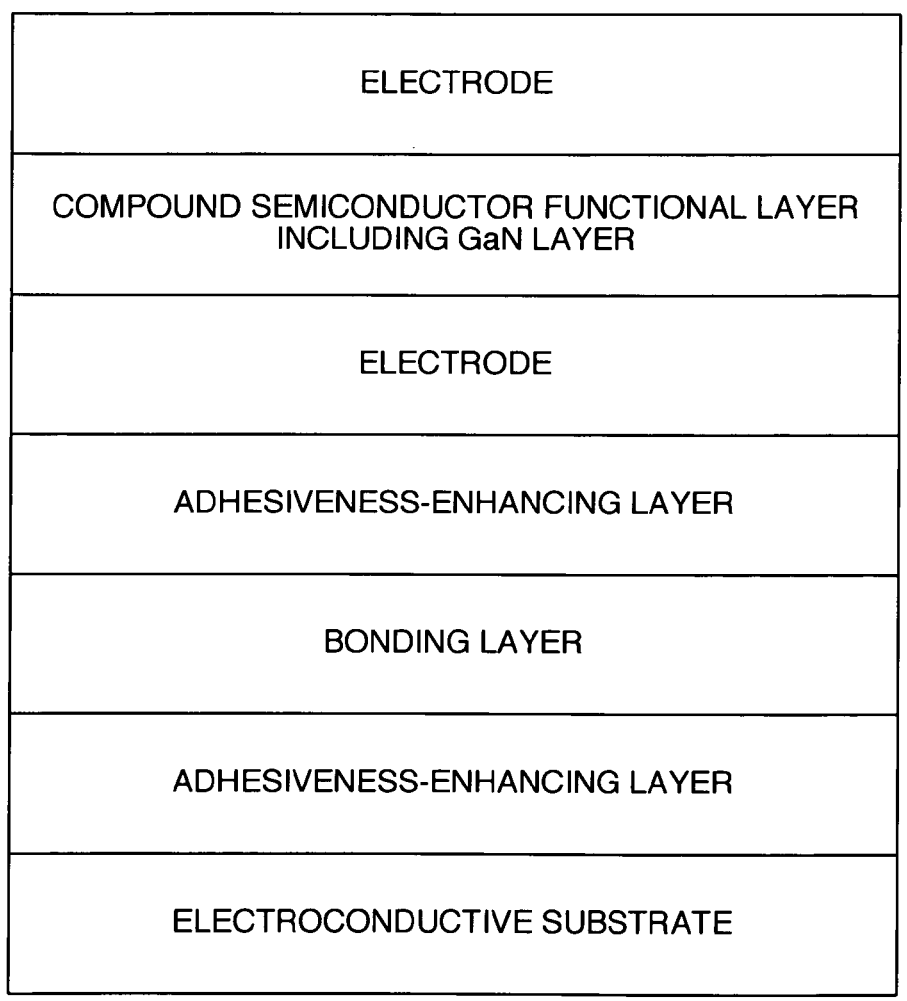
FIG. 1 illustrates an embodiment of the present invention.

The compound semiconductor luminescent device of the present invention is characterized by comprising an electroconductive substrate, a compound semiconductor function layer including a GaN layer, an electrode, an adhesive-enhancing layer and a bonding layer, which are stacked in this order, wherein the electroconductive substrate includes a metal material that indicates a thermal expansion coefficient different by $1.5 \times 10^{-6}/°$ C. or less from GaN.

The compound semiconductor luminescent device of the present invention is characterized by having an electroconductive substrate, a compound semiconductor function layer including a GaN layer, an electrode, an adhesiveness-enhancing layer and a bonding layer in this order, wherein the above-described electroconductive substrate includes a metal material that indicates a thermal expansion coefficient different by b $1.5 \times 10^{-6}/°$ C. or less from GaN.

When an electroconductive substrate including a metal material that indicates a thermal expansion coefficient being different by $1.5 \times 10^{-6}/°$ C. or less from GaN does, is utilized as an electroconductive substrate including a metal material, the luminescence output of a compound semiconductor luminescent device comprising the electroconductive substrate, a compound semiconductor function layer including a GaN layer, and an electrode that are stacked in this order is raised.

The thermal expansion coefficient of GaN is $5.59 \times 10^{-6}/°$ C. (at 300 K, in the direction perpendicular to the c plane of a crystal); therefore, in the present specification, the thermal expansion coefficient being different by $1.5 \times 10^{-6}/°$ C. or less from GaN does, is in a range of $4.1 \times 10^{-6}$ to $7.1 \times 10^{-6}$. In this case, the luminescence output of the compound semiconductor luminescent device tends to rise. It is preferable that the difference in thermal expansion coefficient between the metal material for the electroconductive substrate and GaN is $1.2 \times 10^{-6}/°$ C. or less (i.e., in the present specification, the thermal expansion coefficient is in a range of $4.4 \times 10^{-6}$ to $6.8 \times 10^{-6}$). In addition, the thermal expansion coefficient in the present invention is a linear thermal expansion coefficient at 300 K (23° C.).

Materials for the electroconductive substrate that can be utilized in the present invention and indicate a thermal expansion coefficient different by $1.5 \times 10^{-6}/°$ C. or less from GaN specifically include a metal material mainly composed of one or more selected from the group consisting of W, Mo, Hf, La, Ta, Ir, Ru, Os and Nb (hereinafter referred to as "Composition A"). The thermal expansion coefficients of the above-described metal elements are 4.5, 5.1, 5.9, 6.5, 6.5, 6.6, 6.8, 7.0 and 7.1, respectively, with unit of $10^{-6}/°$ C.; among the above-described metal elements, one or more selected from the group consisting of W, Mo, Hf, La, Ta, Ir and Ru are more preferable because the thermal expansion coefficients thereof differ from that of GaN by $1.2 \times 10^{-6}/°$ C. or less. In addition, one or more selected from the group consisting of W and Mo are further more preferable, and Mo is most preferable. To produce the electroconductive substrate at a low cost with ease, only a few materials are preferably selected, and only one material is more preferably selected from the group of Composition A. Moreover, in the present invention, the metal elements do not include any element that falls under the category of a semimetal (such as Si and Ge).

The electroconductive substrate according to the present invention can include, together with Component A, one or more selected from the group consisting of Si, Ge, Cr, Ti, Rh, Pt, V, Pd, Ni, Co, Fe, Au, Zr, Bi, Cu, Sb, Ag, Mn, Al, Mg, Sn, Cd, Ga, Zn, In, Y, Re, Sr, Ba, Ce, Pr, Nd, Sm, Eu, Gd, Tb, Dy, Ho, Er, Tm, Yb, and Lu (hereinafter referred to as "Component B"), as long as the thermal expansion coefficient does not exceed the above-described range. The electroconductive substrate according to the present invention is preferably composed only of Component A. In addition, elements other than Components A and B may be also included, as unavoidable impurities, in the electroconductive substrate according to the present invention. The concentration of the unavoidable impurities is normally 100 ppm by weight or less, expressed as the concentration of each element.

An electroconductive substrate including a metal material that has a thermal expansion coefficient smaller by $1.5 \times 10^{-6}/°$ C. or less than that of GaN is preferably utilized as an electroconductive substrate including a metal material, since the luminescence output of a compound semiconductor luminescent device comprising the electroconductive substrate, a compound semiconductor function layer including a GaN layer, an electrode, an adhesiveness-enhancing layer and a bonding layer which are stacked in this order is further raised due to unknown reasons.

As the electroconductive substrate including a metal material that has a thermal expansion coefficient smaller by $1.5 \times 10^{-6}/°$ C. or less than that of GaN, one or more selected from the group consisting of W and Mo can be mentioned. To produce the electroconductive substrate at a low cost with ease, only a few materials are preferably selected, only one material is more preferably selected, and Mo is most preferably selected.

In addition, the electric conductivity of the electroconductive substrate according to the present invention is preferably $3 \times 10^4$ Scm$^{-1}$ or more, and more preferably $3 \times 10_6$ Scm$^{-1}$ or more. The upper limit of the electric conductivity is not specifically restricted; however, it is normally about $1 \times 10^6$ Scm$^{-1}$.

The electroconductive substrate is preferably mirror-surface polished in terms of surface roughness, in order to make the substrate easily bonded with the compound semiconductor functional layer. The surface roughness is preferably 1000 Å or less, more preferably 200 Å or less, and still more preferably 100 Å or less.

Too a thin electroconductive substrate has damages such as cracks occurring, for example, and too a thick electroconductive substrate involves a high material cost, for example. Thus, the electroconductive substrate has a thickness of typically 10 μm to 2 mm, preferably 10 to 500 μm, and more preferably 30 to 200 μm.

As the electrode included in the compound semiconductor luminescent device of the present invention, a commonly used p electrode made of a metal such as Au, Pt, Pd, Ni/Au, Ni/ITO, ITO/Ag or Au particles/Pt/Ag, and a commonly used n electrode made of a metal such as ITO, ZnO, Al or Ti/Al can be used.

The compound semiconductor function layer included in the compound semiconductor luminescent device of the present invention denotes a multilayer film necessary for the operation of the luminescent device; the multilayer film preferably consists at least of an n-type electroconductive layer, a p-type electroconductive layer, and a nitride compound semiconductor layer having a luminescence layer that is sandwiched between the n-type electroconductive layer and the p-type electroconductive layer; in some cases, a single layer or multiple layers necessary for making the multilayer film a high-quality crystal may be included in the compound semiconductor function layer. The multilayer film necessary for the operation of the luminescent device specifically denotes a multilayer film including an n-type electroconductive layer, a p-type electroconductive layer, and a multilayer film having a luminescence layer that is sandwiched between the n-type electroconductive layer and the p-type electroconductive layer. The n-type electroconductive layer may be made of a plurality of layers consisting of an n-type contacting layer, an n-type cladding layer, and the like; similarly, the p-type electroconductive layer may be made of a plurality of layers consisting of a p-type contacting layer, a p-type cladding layer, and the like. The single layer or multiple layers necessary for making the multilayer film a high-quality crystal denote a buffer layer, a thick film layer, a superlattice thin film layer, and the like. The structure of normally used compound semiconductor function layers is that in which a buffer layer consisting of GaN, AlN, or the like, a cladding layer consisting of n-GaN, n-AlGaN, or the like, a luminescence layer consisting of InGaN, GaN, or the like, a cladding layer consisting of undoped GaN, p-GaN, or the like, a cap layer consisting of Mg-doped AlGaN or Mg-doped GaN are sequentially stacked (for example, see JP-A-6-260682, JP-A-7-15041, JP-A-9-64419, and JP-A-9-36430).

The method of producing a compound semiconductor luminescent device of present invention will be explained below.

The method of producing a compound semiconductor luminescent device of present invention is characterized by having:

(1) the step of stacking a compound semiconductor function layer including a GaN layer on a growth substrate to obtain a laminate 1;

(2) the step of stacking an electrode, an adhesiveness-enhancing layer and a bonding layer in this order on the compound semiconductor function layer including a GaN layer of the laminate 1 to obtain a laminate 2;

(3) the step of bonding the bonding layer of the laminate 2 with an adhesiveness-enhancing layer of a laminate 3 obtained by stacking the adhesiveness-enhancing layer on a separately prepared electroconductive substrate to obtain a laminate 5, or the step of bonding the bonding layer of the laminate 2 with a bonding layer of a laminate 4 obtained by stacking a adhesiveness-enhancing layer and the bonding layer on a separately prepared electroconductive substrate to obtain a laminate 5, (4) the step of removing the growth substrate from the laminate 5 obtained in the above-described step (3) to obtain a laminate 6 ; and (5) the step of device-dividing the laminate 6 obtained in the above-described step (4);

in this order.

In the first place, a compound semiconductor function layer as described above is epitaxially grown through an MOCVD method on a growth substrate to produce a laminate 1.

As a growth substrate for crystal growth, a conventionally known growth substrate can be utilized. As a growth substrate for the growth of a nitride semiconductor, a growth substrate made of sapphire, SiC, or Si is mentioned.

For example, in the MOCVD method, by heating the growth substrate and supplying an nitrogen raw material gas, a gallium raw material gas, an aluminum raw material gas, an indium raw material gas or the like, the crystal of a compound semiconductor function layer is grown (for example, see JP-A-7-249795, and JP-A-9-116130). As the nitrogen raw material gas, ammonia ($NH_3$) is typically utilized. As the gallium raw material gas, the aluminum raw material gas, and the indium raw material gas, a trialkylated compound or a trihydrogenated compound is typically utilized in which each metal atom is coupled with an alkyl group having 1 to 3 carbon atoms or with hydrogen.

After that, an electroconductive substrate is bonded to the compound semiconductor function layer, wherein the electroconductive substrate includes the above-described metal material and indicates a thermal expansion coefficient being different by $1.5 \times 10^{-6}$/° C. or less, from GaN. For bonding, methods that are typically utilized in the industry, such as thermocompression bonding and metal-solder bonding, can be employed.

Here, an electrode, an adhesiveness-enhancing layer and a bonding layer are stacked in this order on the chemical semiconductor function layer. The adhesiveness-enhancing layer improves adhesiveness between the electrode and the electroconductive substrate, and prevents interdiffusion between them which may occur during a process such as bonding and makes the function of the electrode deteriorate, etc.

As the adhesiveness-enhancing layer a combination of one or more selected from the group consisting of Cr, Ti, Ni and V with one or more selected from the group consisting of W, Mo, Pt, Ag and Cu can be mentioned. Ti/Pt (e.g. a laminate of a Ti deposition film and a Pt deposition film) is particularly preferable due to its high effect as an adhesiveness-enhancing layer.

Although the adhesiveness-enhancing layer may be treated with heat as necessary, cracks or the like may occur in the metal of the electrode or the like in which the metal aggregates as spheres (balls up) by the heat treatment, making the function of the adhesiveness-enhancing layer deteriorate. Ti/Pt is preferably used in this respect, because LED with a high luminescence output can be produced while suppressing occurrence of cracks or the like and preventing deterioration of the function of the adhesiveness-enhancing layer.

Too a thin adhesiveness-enhancing layer makes the above-described function deteriorate, for example, and too a thick adhesiveness-enhancing layer involves a high material cost, for example. Thus, the adhesiveness-enhancing layer has a thickness of typically 10 to 50000 Å, preferably 100 to 10000 Å, and more preferably about 500 to 2000 Å. Such an adhesiveness-enhancing layer is preferably produced also on the electroconductive substrate. Various known methods are adopted as a method of providing the adhesiveness-enhancing layer but a vacuum deposition method is preferable.

As the bonding layer, one or a combination of two or more selected from the group consisting of Sn, In, Pb, Cu, Bi, Ga, Ag, Au, Zn, Ge, Si, Al, Cd, Sb, Ti, Fe and Pd can be mentioned. The bonding layer is preferably Pb-free, and more preferably Au—Sn, in terms of environmental protection. Still more preferably, the bonding layer is Au-rich Au—Sn (e.g. Au 80%-Sn 20%) that can be strongly bonded with an entire wafer uniformly at a low temperature of about 300° C. or less.

Too a thin bonding layer cannot be bonded, for example, and too a thick bonding layer involves a high material cost, for example. Thus, the bonding layer has a thickness of typically 100 to 50000 Å, preferably 1000 to 50000 Å, and more preferably about 5000 to 30000 Å. The thickness also depends on surface roughness of the bonding surface.

The combination of the compound semiconductor function layer, the electrode, the adhesiveness-enhancing layer and the bonding layer is preferably a combination of the compound semiconductor function layer, the electrode, Ti, Pt and Au—Sn, which allows LED with a high luminescence output to be produced in a high device yield (productivity).

In order to improve adhesiveness between the electrode and the electroconductive substrate, the adhesiveness-enhancing layer as described above is also stacked on the electroconductive substrate, and preferably the adhesiveness-enhancing layer and the bonding layer are stacked thereon. The adhesiveness-enhancing layer is particularly preferably Ti/Pt (e.g. a laminate of a Ti deposition film and a Pt deposition film) due to its high effect as an adhesiveness-enhancing layer. The bonding layer is preferably Au—Sn, and more preferably Au-rich Au—Sn (e.g. Au 80%-Sn 20%) that can be strongly bonded with an entire wafer uniformly at a low temperature of about 300° C. or less.

Thereafter, the growth substrate is removed. As a method of removing the growth substrate, a laser liftoff method and a removing method through grinding and/or lapping, or the like can be mentioned (for example, refer to JP-B-2001-501778 and JP-A-11-238913).

Then, after removing the growth substrate, a transparent electrode, a network electrode or the like can be formed as an electrode on the surface from which the growth substrate has been removed. For example, when GaN as a compound semiconductor function layer has been grown immediately on a sapphire substrate as a growth substrate, a thin film Ga may remain on the surface from which the growth substrate has been removed through the laser liftoff method, and the thin film can be used as a semi-transparent electrode. To provide LED with a higher luminescence output, the surface or interface of the compound semiconductor luminescent device, the transparent electrode or the like may be unevenly processed, for example.

Thereafter, the laminate is divided (device-divided) into sizes necessary for exhibiting the function as a device. Thus, the compound semiconductor luminescent device of the present invention can be produced.

In addition, the above-described method preferably involves carrying out device separation prior to the step of bonding the compound semiconductor function layer including a GaN layer with the electroconductive substrate, because the device can be produced in a high yield and the resulting luminescent device exhibits more improved luminescence.

That is, the method of producing a compound semiconductor luminescent device of present invention is characterized by having:

(1) the step of stacking a compound semiconductor function layer including a GaN layer on a growth substrate to obtain a laminate 1;

(2) the step of forming a device separation groove in the compound semiconductor function layer including a GaN layer of the laminate 1 and stacking an electrode, an adhesiveness-enhancing layer and a bonding layer in this order on the separated compound semiconductor function layer to obtain a laminate 7, or the step of stacking an electrode on the compound semiconductor function layer including a GaN layer of the laminate 1, forming a device separation groove in the above-described compound semiconductor function layer and electrode, and stacking an adhesiveness-enhancing layer and a bonding layer in this order on the separated electrode to obtain a laminate 8, or the step of stacking an electrode and an adhesiveness-enhancing layer in this order on the compound semiconductor function layer including a GaN layer of the laminate 1, forming a device separation groove in the above-described compound semiconductor function layer, electrode and adhesiveness-enhancing layer and stacking a bonding layer on the separated adhesiveness-enhancing layer to obtain a laminate 9 or the step of stacking an electrode, an adhesiveness-enhancing layer and a bonding layer in this order on the compound semiconductor function layer including a GaN layer of the laminate 1, and forming a device separation groove in the above-described compound semiconductor function layer, adhesiveness-enhancing layer and bonding layer to obtain a laminate 10;

(3) the step of bonding the bonding layer of any of the laminate 7, the laminate 8, the laminate 9 and the laminate 10 with an adhesiveness-enhancing layer of a laminate 3 obtained by stacking the adhesiveness-enhancing layer on a separately prepared electroconductive substrate to obtain a laminate 11, or the step of bonding the bonding layer of any of the laminate 7, the laminate 8, the laminate 9 and the laminate 10 with a bonding layer of a laminate 4 obtained by stacking an adhesiveness-enhancing layer and the bonding layer on a separately prepared electroconductive substrate to obtain a laminate 11;

(4) the step of removing the growth substrate from the laminate 11 obtained in the above-described step (3) to obtain a laminate 12; and (5) the step of cutting the laminate 12 along the device separation groove formed in the above-described step (2);

in this order.

Prior to the bonding of the electroconductive substrate with the compound semiconductor function layer that has been grown on the growth substrate, a groove for separating devices having a depth that reaches the growth substrate (device separation groove) is formed in the compound semiconductor crystal. Thus, LED with a high luminescence output can be produced in a high device yield. The device separation groove is produced by a method such as dry etching, wet etching, laser processing or dicer processing, and preferably by dry etching which has high processing efficiency and causes only small damages in processing.

In processing for forming the device separation groove, only a small number of laminates is preferably provided on a region in which the device separation groove is to be formed, in order to allow simple processing, and only the compound semiconductor function layer including a GaN layer is more preferably provided thereon. That is, it is more preferable to carry out the step of forming a device separation groove in the compound semiconductor function layer including a GaN layer and stacking an electrode, an adhesiveness-enhancing layer and a bonding layer in this order on the separated compound semiconductor function layer to obtain a laminate.

The compound semiconductor luminescent device comprising the electroconductive substrate, a compound semiconductor function layer including a GaN layer, an electrode, an adhesiveness-enhancing layer and a bonding layer which are stacked in this order has a high luminescence output even in a high current region (e.g. 300 mA), in addition to a typical low current region (e.g. 20 mA).

Embodiments of the present invention are described as above. However, the embodiments of the present invention are disclosed as above simply for illustration, and the scope of the present invention should not be limited to these embodiments. The scope of the present invention is shown by the claims, and includes equivalents to the claims and all modifications within the scope of the present invention.

EXAMPLE

The present invention will be explained below, while referring to an embodiment; however, the present invention is not limited to the Examples.

Example 1

LED-structure nitride semiconductor epitaxial crystals described below were prepared that each had been crystal-grown through the MOCVD method on the (0001) surface of a sapphire growth substrate of 2 inch diameter in size and of 430 μm in thickness. In other words, the epitaxial crystals were a GaN buffer layer of 500 Å in thickness, a Si-doped n-type GaN layer of 4 μm in thickness having an n-type carrier concentration of $5\times10^{18}/cm^3$, an AlGaN ($Al_{0.15}Ga_{0.85}N$) layer of 0.3 μm in thickness having an n-type carrier concentration of $5\times10^{18}/cm^3$ and an Al composition of 15%, a Si-doped n-type GaN layer in 0.3 μm in thickness having an n-type carrier concentration of $1\times10^{17}$, a multi-quantum well active layer having an emission wavelength of 470 nm, that consists of ten sets of an undoped GaN layer of 15 nm in thickness and an undoped InGaN layer of 2.5 nm in thickness, an undoped GaN layer of 15 nm in thickness, a Mg-doped AlGaN layer of 25 nm in thickness having an Al composition of 5%, and a Mg-doped GaN layer of 0.2 µm in thickness. The substrate made of the above-described layers grown on the sapphire growth substrate will be hereinafter referred to as "epi substrate".

By producing, through photolithography, a mask pattern for separating devices from a 3 µm-thick photoresist film formed on the top surface of the grown nitride semiconductor epitaxial crystals and etching the mask pattern through an ICP dry etching method to reach the sapphire growth substrate, separation grooves were formed. The etching gas utilized for the ICP dry etching was a mixed gas composed of $Cl_2$, $CH_2Cl_2$, and Ar; the flow rates were 20, 10, and 40 sccm, respectively; the pressure 2 Pa; the ICP power 200 W; and the bias power 100 W. After the completion of the dry etching, an excess mask portion was removed with an organic solvent.

Subsequently, in order to form an ohmic p electrode on the top surface of the nitride semiconductor epitaxial crystal that was separated as a device, by applying heat treatment to the epi substrate, while holding it at 800° C. for 20 minutes in the presence of $N_2$, the Mg doped layer was changed into a low resistance p-type layer. Next, after surface-processing with hot aqua regia (60° C.) the nitride-semiconductor epitaxial crystal, in order to form a Ni/Au electrode as an ohmic p electrode, in a vacuum deposition apparatus, Ni was deposited to a thickness of 150 Å, and then Au to a thickness of 300 Å; then, an electrode pattern was formed through the lift-off method. Thereafter, by applying heat treatment to the electrode pattern at 500° C. for 10 minutes in the presence of $N_2$ including $O_2$ 5% by volume, the NiAu ohmic p electrode was produced.

Next, a two-inch-diameter Mo electroconductive substrate having a thickness of 100 µm to which mirror-surface polishing had been applied so as to obtain an average surface roughness of 5.8 nm measured by a styllus probe method surface roughness measurement apparatus, was prepared; as a layer for enhancing the adhesiveness of a bonding layer, Ti/Pt layers were formed to 500 Å/500 Å, respectively, on the surface of the Mo electroconductive substrate by a vacuum deposition method, and then were heat-treated while being held at 350° C. for 30 minutes in the presence of $N_2$. Subsequently, as the bonding layer, an Au—Sn alloy layer (Au 80%-Sn 20%) was formed to a thickness of 5000 Å through the vacuum deposition method.

An adhesiveness-enhancing layer and a bonding layer having the same layer structure as the layer structure of those formed on the Mo electroconductive substrate were formed on the area of the epi substrate in which the Ni/Au ohmic p electrode was formed, through the photolithography utilizing the lift-off method and the vacuum deposition method.

Next, the epi substrate and the Mo electroconductive substrate, on each of which each corresponding bonding layer had been formed, were put together with the bonding layers facing each other and were bonded together through the vacuum thermocompression bonding method. Conditions of pressure, temperature, time and a load for the bonding were $1 \times 10^{-3}$ Torr or smaller, 300° C., five minutes, and 6000 N, respectively. The measurement of the warp of the substrate obtained through the bonding (hereinafter referred to as "bonded substrate") indicated 102 µm at the center of the substrate.

Next, the sapphire growth substrate was separated from the bonded substrate through the laser lift-off method. The laser beam that was utilized for the laser liftoff was obtained by converting through a chopper the third harmonic (wavelength of 355 nm) of a CW-excited Q-switch pulse oscillation $YVO_4$ laser beam into a pulse having a frequency of 15 kHz; the third harmonic had an output of 0.47 W and a laser beam diameter of 40 µm. The laser beam was made to enter the sapphire growth substrate, and the bonded substrate was irradiated with the laser beam by defocusing in such a way that the laser beam is focused on the position that is inside the GaN and is at a distance of 170 µm from the epi interface between the sapphire and the GaN. A sample was fixed on a stage by vacuum adsorption, and the stage was linearly scanned at 350 mm/sec. By scanning the sample with the laser beam while moving the sample by 30 µm after scanning for one line, the entire surface of the sample was irradiated with the laser beam. The laser-irradiated bonded substrate was immersed in hot water having a temperature of 60° C. to melt the Ga metal being generated at the epi interface between the sapphire and the GaN, thereby stripping off the sapphire growth substrate.

Through the foregoing processes, a luminescent device on a full-wafer Mo electroconductive substrate was obtained that has a structure in which an LED function layer was bonded through a bonding layer on a Mo electroconductive substrate. On the top surface of the luminescent device, a Ga metal remained a little; however, because the Ga metal itself can be utilized as a semi-transparent ohmic electrode made of n-type GaN, the properties of the luminescent device was evaluated with the GaN metal being left as it is. When, by making the Mo electroconductive substrate and the Ga metal be a positive electrode and a negative electrode, respectively, an electric current of 20 mA was supplied to the device having an electrode diameter of 200 µm, the device demonstrated clear blue-color luminescence and indicated a luminescence output of up to 8 cd.

Example 2

A luminescent device on a full-wafer Mo electroconductive substrate was produced under the same conditions as in Example 1 except that a network Al/Pt/Ni electrode was used as an n-type ohmic electrode instead of the Ga electrode.

First, Ga remaining on the top surface of the nitride semiconductor epitaxial crystal was removed and the above-described surface was made flat through washing with BHF and polishing. Ga with a thickness of about 0.2 µm was removed by polishing at 0.05 MPa at 60 rpm for 10 minutes.

Next, the above-described surface was spin-coated with colloidal silica (manufactured by Fuso Chemical Co., Ltd., trade name: PL-20) with a particle diameter of 0.37 µm diluted to 15 wt %. The surface was spin-coated at 200 rpm for 10 seconds in the presence of a slurry, and subsequently spin-coated at 2500 rpm for 40 seconds.

Next, an AlPtNi electrode pattern was formed through a lift-off method. In order to form an AlPtNi electrode, silica microparticles derived from colloidal silica on the above-described surface for deposition of the electrode were removed by buffered hydrogen fluoride (BHF), and then Al was deposited to 2000 Å, and subsequently Pt was deposited to 500 Å and Ni was deposited to 800 Å in a vacuum deposition apparatus, and the electrode pattern was formed through the lift-off method.

Next, the electrode pattern was etched through an ICP dry etching method using, as a mask, silica microparticles derived from colloidal silica in the opening of the network electrode. Thus, a nitride semiconductor epitaxial crystal in the shape of a microprojection can be formed. The etching gas utilized for the ICP dry etching was a mixed gas composed of $Cl_2$, $CH_2Cl_2$ and Ar; the flow rates were 20, 10, and 40 sccm, respectively; the pressure 0.8 Pa; the ICP power 200 W; the bias power 100 W; and the etching time 7 minutes. Ni functioned as a mask for the ICP dry etching, and a nitride semiconductor epitaxial crystal in the shape of an about 600 nm-high microprojection was formed in the opening of the network AlPtNi electrode.

When an electric current of 20 mA was supplied to the device having an electrode diameter of 200 µm, a network electrode width of 2 µm, a network electrode pitch of 25 µm, an electrode pad of 50 µm squares and an opening ratio of 85%, the device demonstrated clear blue-color luminescence uniformly within the surface and indicated a luminescence output of up to 10 cd.

Example 3

A bonded substrate was produced under the same conditions as in Example 1 except that a mirror-surface polished electroconductive substrate made of W of 2 inch diameter in size, 100 µm in thickness and 12.2 nm in average surface roughness was used as the electroconductive substrate instead of the electroconductive substrate made of Mo. The measurement of the warp of the bonded substrate indicated 113 µm at the center of the substrate. A luminescent device on a full-wafer W electroconductive substrate was produced using this substrate. When an electric current of 20 mA was supplied to the device having an electrode diameter of 200 µm, the device demonstrated clear blue-color luminescence uniformly within the surface and indicated a luminescence output of up to 6 cd.

Example 4

A bonded substrate was produced under the same conditions as in Example 1 except that a mirror-surface polished electroconductive substrate made of Ta of 2 inch diameter in size, 100 µm in thickness and 9.8 nm in average surface roughness was used as the electroconductive substrate instead of the electroconductive substrate made of Mo. The measurement of the warp of the bonded substrate indicated 20 µm at the center of the substrate. A luminescent device on a full-wafer Ta electroconductive substrate was produced using this substrate. When an electric current of 20 mA was supplied to the device having an electrode diameter of 200 µm, the device demonstrated clear blue-color luminescence uniformly within the surface and indicated a luminescence output of up to 4 cd.

Comparative Example 1

A bonded substrate was produced under the same conditions as in Example 1 except that a mirror-surface polished electroconductive substrate made of Cu of 2 inch diameter in size, 100 µm in thickness and 5.5 nm in average surface roughness was used as the electroconductive substrate instead of the electroconductive substrate made of Mo. However, because the bonding of the entire wafer was not enabled with a sufficient strength, no LED could be produced. Due to excessively large difference in thermal expansion coefficient between Cu and GaN, a large warp occurred followed by separation between the electroconductive substrate and the compound semiconductor function layer.

Comparative Example 2

A bonded substrate was produced under the same conditions as in Example 1 except that a mirror-surface polished electroconductive substrate made of Cu of 2 inch diameter in size and 1000 µm in thickness was used as the electroconductive substrate instead of the electroconductive substrate made of Mo. However, because the bonding of the entire wafer was not enabled with a sufficient strength, no LED could be produced. A large warp occurred followed by separation between the electroconductive substrate and the compound semiconductor function layer.

Comparative Example 3

A bonded substrate was produced under the same conditions as in Example 1 except that a mirror-surface polished electroconductive substrate made of Al of 2 inch diameter in size, 1000 µm in thickness and 2.7 nm in average surface roughness was used as the electroconductive substrate instead of the electroconductive substrate made of Mo. However, because the bonding of the entire wafer was not enabled with a sufficient strength, no LED could be produced. A large warp occurred followed by separation between the electroconductive substrate and the compound semiconductor function layer.

The invention claimed is:

1. A compound semiconductor luminescent device comprising:
    (a) an electroconductive substrate;
    (b) an adhesiveness-enhancing layer;
    (c) a bonding layer;
    (d) an adhesiveness-enhancing layer;
    (e) an electrode;
    (f) a compound semiconductor function layer including a GaN layer and
    (g) an electrode,
    wherein all the elements(a) to (g) are stacked in this order, and
    wherein the electroconductive substrate consists of a Mo material that has a thermal expansion coefficient smaller by $1.5 \times 10^{-6}/°$ C. or less than GaN.

2. A compound semiconductor luminescent device having:
    (a) an electroconductive substrate;
    (b) an adhesiveness-enhancing layer;
    (c) a bonding layer;
    (d) an adhesiveness-enhancing layer;
    (e) an electrode;
    (f) a compound semiconductor function layer including a GaN layer; and
    (g) an electrode,
    wherein all the elements (a) to (g) are stacked in this order, and wherein the electroconductive substrate consists of a Mo material that has a thermal expansion coefficient smaller by $1.5 \times 10^{-6}/°$ C. or less than GaN.

3. The compound semiconductor luminescent device according to claim 1, wherein the compound semiconductor function layer including a GaN layer has at least an n-type electroconductive layer, a nitride compound semiconductor layer with a luminescence layer, and a p-type electroconductive layer in this order.

4. The compound semiconductor luminescent device according to claim 1, wherein the adhesiveness-enhancing layer is a metal material composed of TiPt, and the bonding layer is a metal material composed of AuSn.

* * * * *